(12) United States Patent
Salot et al.

(10) Patent No.: US 7,807,279 B2
(45) Date of Patent: Oct. 5, 2010

(54) INTEGRATED MICROCOMPONENT COMBINING ENERGY RECOVERY AND STORAGE FUNCTIONS

(75) Inventors: Raphael Salot, Lans-En-Vercors (FR); Frederic Gaillard, Voiron (FR); Jean-Yves Laurent, Domene (FR); Marc Plissonnier, Eybens (FR)

(73) Assignee: Commissariat a l'Energie Atomique, Paris (FR)

( * ) Notice: Subject to any disclaimer, the term of this patent is extended or adjusted under 35 U.S.C. 154(b) by 468 days.

(21) Appl. No.: 11/749,828

(22) Filed: May 17, 2007

(65) Prior Publication Data

US 2007/0275300 A1    Nov. 29, 2007

(30) Foreign Application Priority Data

May 24, 2006    (FR) .................................. 06 04707

(51) Int. Cl.
*H01M 2/02* (2006.01)
(52) U.S. Cl. .............................. 429/7; 429/163; 429/185
(58) Field of Classification Search .................... 429/7, 429/163, 181, 185
See application file for complete search history.

(56) References Cited

U.S. PATENT DOCUMENTS

| | | | | |
|---|---|---|---|---|
| 5,180,645 A | * | 1/1993 | More ...................... | 429/163 X |
| 7,524,577 B2 | * | 4/2009 | Bates ...................... | 429/185 X |
| 2002/0004167 A1 | | 1/2002 | Jenson et al. ................ | 429/162 |
| 2003/0152815 A1 | | 8/2003 | LaFollette et al. .............. | 429/7 |
| 2004/0049909 A1 | | 3/2004 | Salot et al. .................. | 29/623.5 |

FOREIGN PATENT DOCUMENTS

| | | |
|---|---|---|
| FR | 2 831 331 | 4/2003 |
| FR | 2 874 128 | 2/2006 |
| WO | WO 00/45457 | 8/2000 |
| WO | WO 2006/024721 A2 | 3/2006 |

* cited by examiner

*Primary Examiner*—Stephen J. Kalafut
(74) *Attorney, Agent, or Firm*—Oblon, Spivak, McClelland, Maier & Neustadt, L.L.P.

(57) ABSTRACT

A microcomponent including: an electrochemical storage source; a first substrate including a first contact face; a second substrate including a second contact face; "at least one internal cavity formed from a first cavity recessed into the first contact face of the first substrate, or from a second cavity recessed into the second contact face of the second substrate, or from the first cavity recessed into the first contact face of the first substrate and the second cavity recessed into the second contact face of the second substrate, wherein the two substrates are integrated together via their respective contact faces and a sealing member, and said internal cavity contains the electrochemical storage source; and electrical connections between the electrochemical storage source and an external environment.

17 Claims, 4 Drawing Sheets

INTEGRATED MICROCOMPONENT COMBINING ENERGY RECOVERY AND STORAGE FUNCTIONS

TECHNICAL FIELD

The invention relates to the field of production of a component performing the functions of electrochemical storage of energy in a reduced (microscopic) volume and allowing for optimised integration with an energy recovery source and an energy control system (ASIC), for example. The system as a whole is then perfectly suitable for supplying power to MEMS ("Microelectromechanical Systems").

The main field of application targeted involves "ambient intelligence", i.e. microsensors (abandoned, possibly connected to the network) sometimes designated by the terms "smart dust", "e-grains", and so on. This type of product requires a number of associated functions in a very small volume (typically a surface of several mm$^2$ to 1 cm$^2$, with a thickness of less than 1 mm): communication, sensor, energy, onboard intelligence. The invention relates to the energy portion of these systems, possibly associated with the intelligence.

PRIOR ART

Electrochemical systems for storing energy can be classified into two categories: supercapacitances and batteries.

Supercapacitances have the possibility of generating large amounts of power, but to the detriment of the amount of energy stored by comparison with a battery. The current highest-performing supercapacitance systems have a capacitance of around 7 mF (i.e. on the order of 10 µAh for the voltages considered). The major problem lies in the problem of integration and the reduction of the size to a micrometric scale.

Batteries, of which the size can be reduced for integration purposes, essentially consist of two types: all-solid batteries (hereinafter referred to as microbatteries) produced by vacuum deposition techniques, with a thickness of several micrometers, and batteries obtained by coating with a thickness on the order of several hundred micrometers (hereinafter called minibatteries). Nevertheless, another solution based on a liquid electrolyte, which can be integrated, has also been proposed (see the patent application US 2005/0110457).

"All-solid" microbatteries in the form of thin films are the subject of numerous publications and patents. The principle of operation is based on the insertion and deinsertion (or intercalation-deintercalation) of an alkaline metal ion or a proton in the positive electrode. The system presented uses, as the ionic species Li$^+$ from, for example, a metallic lithium electrode. All of the layers composing the microbattery (current collectors, positive and negative electrodes, electrolyte, encapsulation) are obtained by PVD deposition (for "Physical Vapour Deposition") or CVD deposition (for "Chemical Vapour Deposition"). The total thickness of the stack is on the order of 15 µm. Various materials can be used.

The current collectors are metallic and can be, for example, based on Pt, Cr, Au or Ti.

The positive electrode can be constituted by $LiCoO_2$, $LiNiO_2$, $LiMn_2O_4$, CuS, $CuS_2$, $WO_yS_z$, $TiO_yS_z$, $V_2O_5$, or $V_3O_8$ as well as lithiated forms of these vanadium oxides and metallic sulphides. Depending on the materials selected, a thermal annealing process may be necessary in order to increase the crystallization of the films and their insertion property. Nevertheless, certain amorphous materials, in particular titanium oxysulfides, do not require such a treatment, while allowing for a high lithium ion insertion.

The electrolyte must be a good ionic conductor and electric insulator. It is generally a vitreous material based on boron oxide, lithium oxides or lithium salts.

The negative electrode can be metallic lithium deposited by thermal evaporation, a metallic alloy based on lithium or an insertion compound (SiTON, $SnN_x$, $InN_x$, $SnO_2$, ...).

The encapsulation is intended to protect the active stack from the external environment and specifically moisture. It can be constituted by ceramic, polymer (hexamethyldisiloxane, parylene) or metal, as well as overlapping layers of these different materials.

Depending on the materials used, the operation voltage of this type of object is between 2 and 4 V. The surface capacitances are on the order of 100 µAh/cm$^2$. The techniques used enable objects of all surfaces and shapes to be produced.

At a constant surface, the capacitance of these systems can be increased primarily in two ways:
  increasing the thickness of the electrodes,
  overlapping microbatteries connected in parallel.

These techniques are nevertheless difficult to implement. It is indeed difficult to obtain layers having a thickness greater than 10 µm by PVD while maintaining the initial properties. In addition, the volume changes caused in the various layers by the diffusion of lithium result in major constraint problems in the systems including stacked microbatteries.

Minibatteries are usually produced by coating techniques. The production of these objects is in fact a scaling down of the existing systems, obtained by a development of the production process. The total thickness is on the order of several hundred µm (300 to 650 µm). These minibatteries are produced by the current battery manufacturers, and have begun to appear on the market. They will be commercialised for dedicated applications (for example, development for supplying power to smart card displays).

The surface capacitances of these systems are greater than those of microbatteries (several mAh/cm$^2$ compared with 100 µAh/cm$^2$). However, their thickness makes them incompatible with a positioning on a smart card integrated circuit (maximum thickness of the assembly 0.76 mm) and they are difficult to integrate in small volumes (less than 1 mm$^3$). The layers are currently produced on metallic supports that are then assembled by pressing. It is not possible to product small surfaces (less than 1 mm$^2$). Moreover, these devices are not encapsulated.

The patent application US 2005/0110457 proposes a mixed solution using both electrode layers deposited by thin film techniques (CVD, PVD, electrodeposition) and a liquid electrolyte. Nevertheless, the production process is based on a stacking of layers on a single substrate. A cavity is created between the two electrode layers by shrinkage of a portion of an electrode and a polyimide spacer. Such a configuration requires significant mechanical stress on the upper electrode layer, which is the only to support the encapsulation. In addition, the latter can in no case be an active element (i.e. contain an integrated circuit or an energy recovery component, for example).

Much less work is being done on the hybridisation of energy recovery and storage microsystems than on the individual systems. The relative weakness of the current production lies in the problems of integration.

The most advanced integration efforts for integrating energy micro-recovery and micro-storage are being conducted by Bipolar Technologies Corp. This is an American company that, in collaboration with Brigham Young University, is developing an energy-providing microsystem based on Ni—Zn microbatteries (with liquid electrolyte) connected to solar cells. This microsystem is designed according to a planar architecture in which all of the elements are arranged side-by-side, which takes up a large surface and volume, thus reducing the volume (or mass) energy density available.

DESCRIPTION OF THE INVENTION

The purpose of the invention is to obtain an integrated component capable of combining the recovery, storage and possibly the control of energy, all in a very small volume (capable of having a thickness under 1 mm and ranging from several $\mu m^2$ to several $cm^2$ at the surface) and with the maximum onboard energy. This is obtained by utilising the volume of the substrates possibly for the recovery of energy and/or the production of the onboard intelligence (integrated circuit) so as to produce the energy storage.

A first object of the invention relates to a microcomponent including an electrochemical storage source, characterised in that it includes a first substrate having a contact face and a second substrate having a contact face, at least one cavity being formed in at least one of the substrates from the contact face, the two substrates being integrated with said contact faces by sealing means, wherein said cavity, thus sealed, contains the electrochemical storage source, and the microcomponent provides the electrical connections between the electrochemical storage source and the external environment.

The microcomponent advantageously also includes an energy recovery device and means for electrically connecting the energy recovery device with the electrochemical storage source. It can also include an integrated circuit making it possible to control the means for electrical connection between the electrochemical storage source and the external environment.

The electrical connections can include electrical connections passing through at least one of the substrates. They can also include wire connections outside of the substrates.

The sealing means can include a conductive anisotropic film placed between the two substrates and allowing for an electrical connection between the two substrates.

The electrochemical storage source can include a first electrode integrated with the first substrate and a second electrode integrated with the second substrate. Chemical protection means can be placed between an electrode and the substrate with which it is integrated.

At least one of the substrates can be made of a semiconductor material, for example silicon.

BRIEF DESCRIPTION OF THE DRAWINGS

The invention can be better understood, and other advantages and special features will appear on reading the following description, given by way of a non-limiting example, accompanied by the appended drawings, in which.

DETAILED DESCRIPTION OF SPECIFIC EMBODIMENTS

Figure 1A:
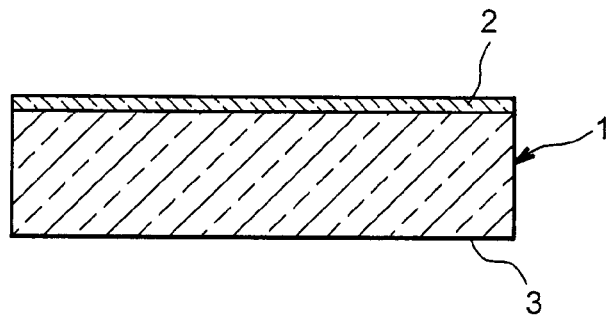
FIGS. 1A to 1D show a method for treating a first substrate in order to produce a microcomponent according to this invention.
Figure 1B:
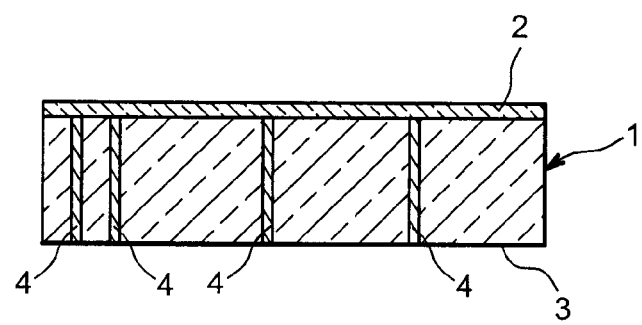
Figure 1C:
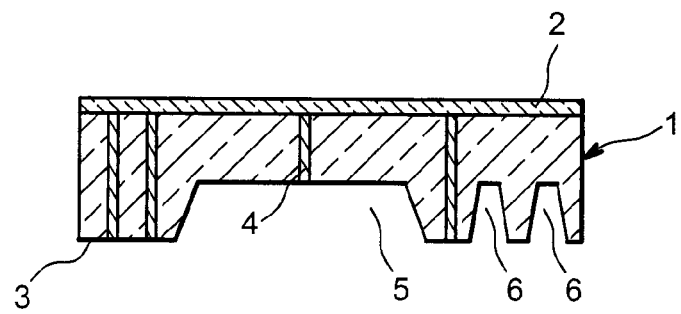
Figure 1D:
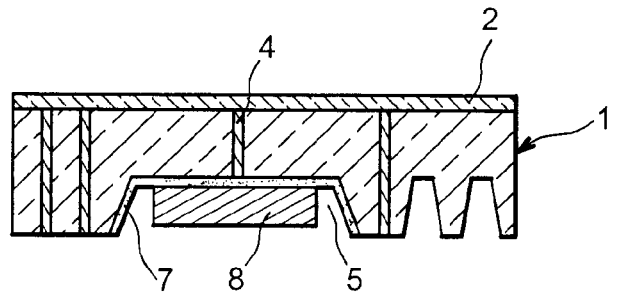

According to the invention, two substrates are assembled, closing up at least one cavity, which makes it possible to use the available volume of the cavity for the production of an electrochemical storage source. Thus, each of the substrates can comprise a part of the technology needed to produce an energy storage system. With this architecture as the basis, a number of cases can be modified. In every case, at least one cavity is formed on the rear face (or contact face) of at least one of the substrates. A cavity produced in both substrates makes it possible to maximise the effective volume for the energy source. In the case of a silicon substrate, the cavity is typically obtained by localised KOH etching. The wall of the cavity must be inert with respect to the electrolyte used. For this, it may be necessary to deposit a chemical and electrical insulation layer on the wall of the cavity. This layer can be, for example, a polymer. On this layer, a metal (Ti, Cr, Au, Pt, etc.) electrical conductor compatible with the electrode materials used is then deposited. If the assembly of the two substrates results in mutual electrical insulation, the inerting layer of the cavity can be made directly with a metal, and also act as a current collector.

According to a first embodiment, a battery or supercapacitance electrode layer is deposited on each substrate (positive on one and negative on the other). In this case, the electrolyte eventually present in the cavity is liquid. This makes it possible to use thick electrode layers (from 10 to several hundred $\mu m$) because the electrolyte can saturate these layers. It is then possible to obtain very high capacitances (up to several 100 $mAh/cm^2$). According to the systems present on the substrates (integrated circuit, energy recovery system), the electrode layers can be chosen so that they do not have to undergo a thermal annealing operation at temperatures above that causing deterioration of the systems already present. Thus, a layer requiring an annealing at 700° C. will not be produced on the rear face of a circuit. Potentially, such a layer can be produced on the rear face of the substrate before performing other treatments on the front surface. In some cases, a protection (resin-type) can be deposited so as to protect this layer during the treatment of the front face.

The electrode layers of the batteries or supercapacitances can be deposited by any technique making it possible to obtain the desired thicknesses. Thus, it is possible to use techniques using inks (typically containing the active element capable of inserting lithium for example, a polymer binder and an electrical conductor), such as inkjet, serigraphy, flexography, offset and so on. The vacuum deposition techniques (CVD, PECVD, PVD, etc.) can also be used. Techniques allowing for localisation of the deposition and a fast deposition speed are preferred.

According to a second embodiment, all of the layers necessary for producing a battery or supercapacitance (electrodes and electrolyte) are deposited on each substrate. This configuration has the disadvantage of depositing more layers than in the first embodiment, but it has the advantage of making it possible to have two different systems on each of the faces. Therefore, it is possible, for example, to have a series-connection of these systems and therefore to double the output voltage. In the case of a lithium battery, it is thus possible to obtain a system generating voltages above 8 V. In another configuration, it is possible to choose systems with different characteristics (battery and supercapacitance, batteries with different electrochemical couples, batteries with different electrode thicknesses and therefore a different power behaviour). Such a solution makes it possible, for example, to adapt one of the sources to energy recovery (low current) and the other to the power supply of a sensor (high current pulses).

This configuration requires additional electrical connections: current collector on the external electrodes.

The electrolyte used is liquid and common to the two systems. In this case, the electrolyte layers deposited previously are porous polymer-type membranes acting as an electrical and mechanical insulation between the electrodes and capable of "soaking up the liquid electrolyte".

The assembly of the two substrates can be obtained in different ways. Two solutions are preferable. According to a first solution, a sealed pre-assembly of the two substrates is produced, and the microcomponent is immersed in the electrolyte after deposition of a glue on the periphery. The bonding can be improved by heating and pressing. If the seal is not sufficient, it is possible to create a perfect seal, outside of the electrolyte, by the "glop top" encapsulating method. According to a second solution, the cavity is filled after assembly of the two substrates performed, for example, by anodic bonding. The filling of the cavity can then be performed laterally by the presence of micro-channels in one or the other of the substrates, or vertically by a hole produced on one of the substrates. Capillarity is advantageously used to the introduce the liquid. The opening needed for the filling is then closed by means of a pip or with a resin.

According to the embodiment used to obtain the microcomponent, various connector solutions are possible. The most integrated solution consists of preparing connections passing through the substrate (provided before the electrode layer depositions). Such an architecture makes it possible to be more effective in terms of bulk: the volume of the substrates contains not only the energy sources, but also the electrical connections. Ideally, the bonding between the two substrates can be obtained by means of an ACF (anisotropic conductive film) polymer allowing for electrical conduction. The electrical connection can therefore be provided only on the rear face or by the assembly portion of the cavity. Independently of this solution, it is also possible to produce wire connections after providing the current collectors of the energy systems outside the cavity.

In the following description, the microcomponent according to the invention comprises only a single cavity. It is nevertheless possible to create a multitude of small cavities side-by-side thus making it possible to have a network of energy storage micro-sources and connecting them as desired in series or in parallel. Such a solution is completely versatile and makes it possible to adapt to various applications or different operating modes for the same application. In addition, distributing the electrochemical storage source over the two substrates means distributing the appropriate deposition steps over each substrate, according to its possible fragility due, for example, to the presence of active circuits.

FIGS. 1A to 1D show a method for treating a first substrate in order to produce a microcomponent according to this invention. These are transverse cross-section views.

FIG. 1A shows a first silicon substrate 1 on a main face on which an integrated circuit 2 has been produced. The face 3, opposite the integrated circuit 2, constitutes the contact face of the first substrate 1. Then, electrical through-connections 4 are produced by etching, then by filling with a conductive material. They make it possible to electrically connect the integrated circuit 2 to the contact face 3 (see FIG. 1B). The substrate 1 is then etched from the contact face 3 (by localised KOH etching) so as to provide a cavity 4 and channels 6 serving to introduce the electrolyte and ending laterally (see FIG. 1C). An insulation layer (chemical and electronic) 7, for example a silicon nitride layer or silica, is then deposited on the wall of the cavity 5 (see FIG. 1D) and an electrode 8 is provided at the base of the cavity, making sure to produce the corresponding electrical connection between the electrode 8 and the integrated circuit 2.

FIGS. 2A to 2D show a method for treating a second substrate in order to produce a microcomponent according to this invention. These are transverse cross-section views.

Figure 2A:
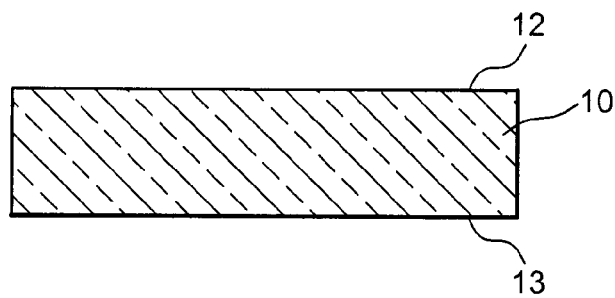
FIGS. 2A to 2D show a method for treating a second substrate in order to produce a microcomponent according to this invention.
Figure 2B:
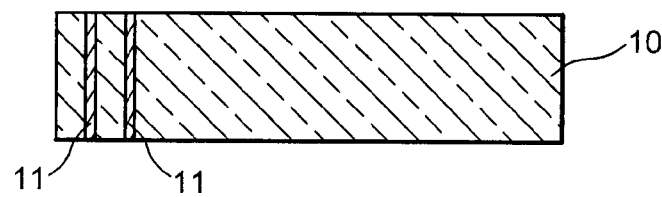
Figure 2C:
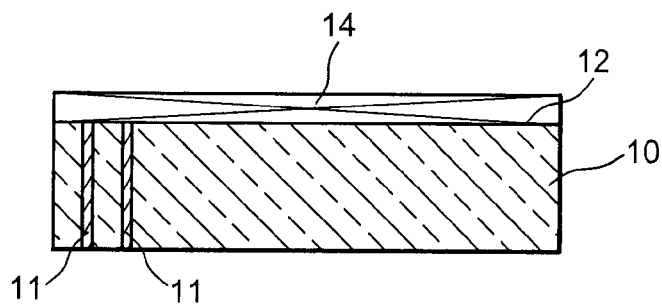
Figure 2D:
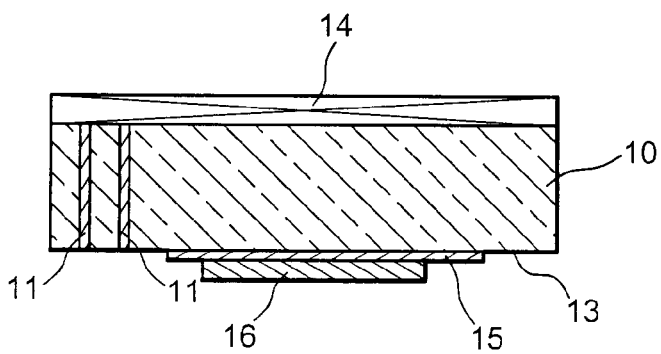

FIG. 2A shows a second silicon substrate 10 having a first face 12 and a second face 13, called a contact face. Electrical through-connections 11 are produced in the substrate 10, in particular so as to establish electrical connections with some of the electrical through-connections 4 of the substrate 1 (see FIG. 2B). FIG. 2C shows an energy recovery device 14 attached (for example by bonding) to the face 12 of the substrate 10. The device 14 is electrically connected to the connections 11. A chemical and electrically conductive insulation layer 15, for example, made of metal is deposited on the contact face 13 (see FIG. 2D). An electrode 16 is deposited on the insulation layer 15.

One of the two electrodes 8 or 16 is a positive electrode and the other is a negative electrode. The negative electrode can be composed of silicon obtained by PECVD and form a layer with a thickness of 1 µm. The positive electrode can be obtained by serigraphy using $LiCoO_2$ and form a layer with a thickness of 200 µm.

Figure 3:
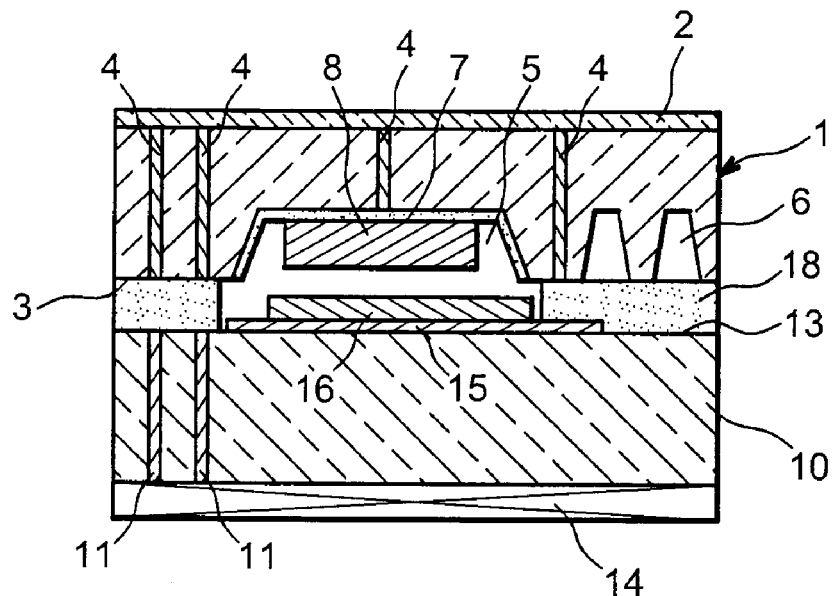
FIG. 3 is a cross-section view of a microcomponent according to this invention.

FIG. 3 is a cross-section view of a microcomponent according to this invention, obtained by integrating the substrates 1 and 10 according to their contact faces 3 and 13. The integration of the substrates 1 and 10 is obtained by bonding with an anisotropic conductive film or ACP, i.e. a film allowing for vertical electrical conduction with respect to the plane of the film and electrical insulation in the plane of the film. Thus, the integrated circuit 2 can be electrically connected to the energy recovery device 14 by means of electrical connections 4 and 11. The integrated circuit 2 is also electrically connected to the electrode 8 by a through-connection 4 and to the electrode 16 by another through-connection 4, the metal layer 15 and the anisotropic conductive film 18.

The electrolyte is then introduced into the cavity 5 by capillarity using the channels 6 of which the access is then closed off.

Figure 4:
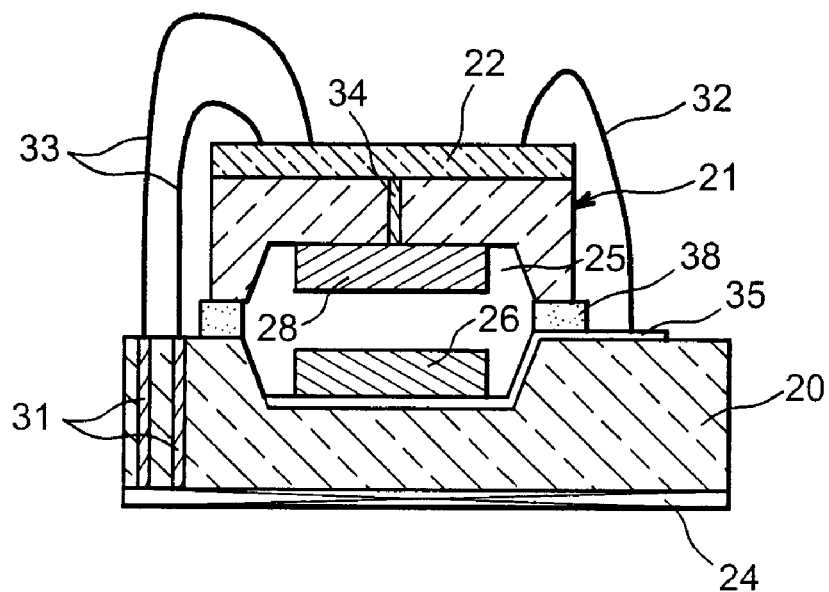
FIG. 4 is a cross-section view of another microcomponent according to this invention.
Figure 5:
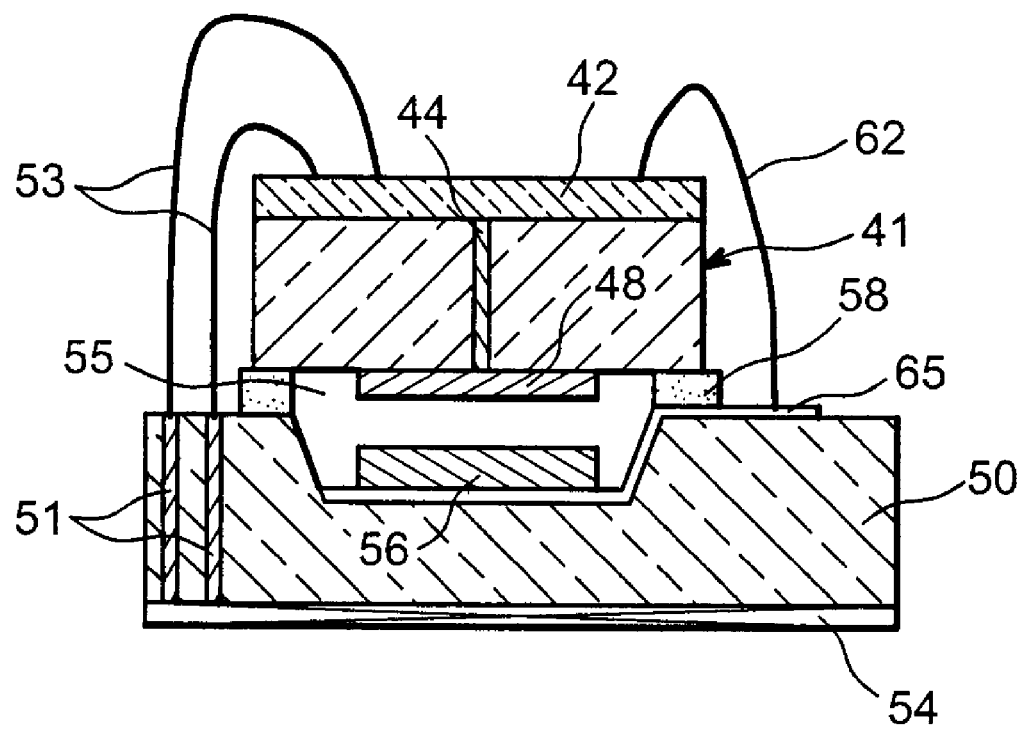
FIG. 5 is a cross-section view of yet another microcomponent according to this invention.

Other electrical connection techniques can be used, as shown in FIGS. 4 and 5.

The microcomponent shown in a transverse cross-section in FIG. 4 includes a first substrate 21 of which a first main face supports an integrated circuit 22 and of which the second main face constitutes the contact face of this first substrate. The microcomponent also includes a second substrate 20 of which a first main face supports an energy recovery device 24 and of which the second main face constitutes the contact face of this second substrate. The internal cavity 25 is constituted by a first cavity produced in the substrate 21 and a second cavity produced in the substrate 20. On the cavity side 25, the first substrate 21 supports an electrode 28 and the second substrate 20 supports an electrode 26. A through-connection 34, produced in the first substrate 21, electrically connects the integrated circuit 22 to the electrode 28. A conductive layer 35, placed between the second substrate 20 and the electrode 26, is extended over the free portion of the contact face of the second substrate 20. An external wire connection 32 is established so as to electrically connect the integrated circuit 22 to the electrode 26 via the conductive layer 35. The second substrate 20 includes through-connections 31 making it possible to electrically connect the energy recovery device 24 to the integrated circuit 22 by means of external wire connections 33. The cavity 25 is filled with electrolyte. The seal 38 performs the function of sealing the cavity 25.

The microcomponent shown in a transverse cross-section in FIG. 5 includes a first substrate 41 of which a first main face supports an integrated circuit 42 and of which the second main face constitutes the contact face of this first substrate. The microcomponent also includes a second substrate 50 of which a first main face supports an energy recovery device 54 and of which the second main face constitutes the contact face of this second substrate. The internal cavity 55 has been produced only in the second substrate 50. On the cavity side 55, the first substrate 41 supports an electrode 48 and the second substrate 50 supports an electrode 56. A through-connection 44, produced in the first substrate 41, electrically connects the integrated circuit 42 to the electrode 48. A conductive layer 65, placed between the second substrate 50 and the electrode 56, is extended over the free portion of the contact face of the second substrate 50. An external wire connection 62 is established so as to electrically connect the integrated circuit 42 to the electrode 56 via the conductive layer 65. The second substrate 50 includes through-connections 51 making it possible to electrically connect the energy recovery device 54 to the integrated circuit 42 by means of external wire connections 53. The cavity 55 is filled with electrolyte. The seal 58 performs the function of sealing the cavity 55.

This technique is particularly suitable for sources with liquid electrolyte (such as ionic liquid-type electrolytes), but can be used perfectly well for solid electrolytes.

The invention claimed is:

1. A microcomponent comprising:
   an electrochemical storage source;
   a first substrate including a first contact face;
   a second substrate including a second contact face;
   at least one internal cavity formed from a first cavity recessed into the first contact face of the first substrate, or from a second cavity recessed into the second contact face of the second substrate, or from the first cavity recessed into the first contact face of the first substrate and the second cavity recessed into the second contact face of the second substrate,
   wherein the two substrates are integrated together via their respective contact faces and a sealing member, and
   said internal cavity contains the electrochemical storage source; and
   electrical connections between the electrochemical storage source and an external environment.

2. The microcomponent according to claim 1, further comprising:
   an energy recovery device,
   wherein one of the electrical connections connects the energy recovery device with the electrochemical storage source.

3. The microcomponent according to claim 1, further comprising:
   an integrated circuit it possible to control that controls the electrical connections between the electrochemical storage source and the external environment.

4. The microcomponent according to claim 1, wherein the electrical connections include electrical connections passing through at least one of the substrates.

5. The microcomponent according to claim 1, wherein the electrical connections include wire connections outside of the substrates.

6. The microcomponent according to claim 1, wherein the sealing member includes a conductive anisotropic film, and the sealing member is disposed between the first and second substrates to provide an electrical connection between the first and second substrates.

7. The microcomponent according to claim 1, wherein the electrochemical storage source includes a first electrode integrated with the first substrate and a second electrode integrated with the second substrate.

8. The microcomponent according to claim 7, further comprising:
   a chemical protection member disposed between the first electrode and the first substrate.

9. The microcomponent according to claim 1, wherein at least one of the first substrate or the second substrate is made of a semiconductor material.

10. The microcomponent according to claim 9, wherein the semiconductor material is silicon.

11. The microcomponent according to claim 7, further comprising:
    a chemical protection member disposed between the second electrode and the second substrate.

12. The microcomponent according to claim 7, further comprising:
    a conductive layer between the second substrate and the second electrode that extends over a free portion of the second contact face of the second substrate.

13. The microcomponent according to claim 7, further comprising:
    an integrated circuit that controls the electrical connections between the electrochemical storage source and the external environment;
    a conductive layer between the second substrate and the second electrode that extends over a free portion of the second contact face of the second substrate; and
    an external wire connection electrically connecting the integrated circuit to the second electrode via the conductive layer.

14. The microcomponent according to claim 1, further comprising:
    an energy recovery device attached to the second substrate;
    an integrated circuit, which controls the electrical connections between the electrochemical storage source and the external environment, attached to the first substrate,
    wherein the energy recovery device and the integrated circuit are attached on opposite sides of the internal cavity.

15. The microcomponent according to claim 1, wherein the internal cavity is formed from the first cavity recessed into the first contact face of the first substrate.

16. The microcomponent according to claim 1, wherein the internal cavity is formed from the second cavity recessed into the second contact face of the second substrate.

17. The microcomponent according to claim 1, wherein the internal cavity is formed from the first cavity recessed into the first contact face of the first substrate and the second cavity recessed into the second contact face of the second substrate.

* * * * *